United States Patent
Chiang et al.

(10) Patent No.: US 10,482,966 B2
(45) Date of Patent: Nov. 19, 2019

(54) BLOCK DECODER OF NONVOLATILE MEMORY AND LEVEL SHIFTER

(71) Applicant: Winbond Electronics Corp., Taichung (TW)

(72) Inventors: Ju-An Chiang, Hsinchu (TW); Ya-Wen Chang, Jhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/153,048

(22) Filed: Oct. 5, 2018

(65) Prior Publication Data

US 2019/0147956 A1 May 16, 2019

(30) Foreign Application Priority Data

Nov. 16, 2017 (CN) .......................... 2017 1 1136038

(51) Int. Cl.
| | | |
|---|---|---|
| G11C 16/08 | (2006.01) | |
| H03K 3/356 | (2006.01) | |
| G11C 7/12 | (2006.01) | |
| H03K 19/0185 | (2006.01) | |
| G11C 8/10 | (2006.01) | |

(52) U.S. Cl.
CPC ................ G11C 16/08 (2013.01); G11C 7/12 (2013.01); H03K 3/356113 (2013.01); *G11C 8/10* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 5,202,851 A | 4/1993 | Do | |
| 8,184,489 B2 | 5/2012 | Tanzawa | |
| 8,456,929 B2 * | 6/2013 | Liles | ................ H03K 3/356182 365/189.11 |
| 8,531,229 B2 | 9/2013 | Shen et al. | |
| 9,349,457 B2 | 5/2016 | Kim et al. | |
| 2005/0052214 A1 * | 3/2005 | Sushihara | ........ H03K 3/356113 327/333 |
| 2006/0226874 A1 * | 10/2006 | Kim | ................ H03K 3/356113 326/81 |
| 2008/0137448 A1 * | 6/2008 | Campbell | ............... G11C 5/143 365/189.11 |
| 2010/0109743 A1 * | 5/2010 | Czech | .............. H03K 3/356113 327/333 |

* cited by examiner

*Primary Examiner* — Tan T. Nguyen
(74) *Attorney, Agent, or Firm* — Muncy, Geissler, Olds & Lowe, P.C.

(57) ABSTRACT

A block decoder of nonvolatile memory includes a level shifter and a decoder. A first transistor has a control terminal coupled to a first control node, a first terminal coupled to an output node, and a second terminal coupled to a first supply voltage. A second transistor has a control terminal coupled to a second control node, a first terminal coupled to a ground voltage, and a second terminal coupled to the output node. A third transistor has a control terminal coupled to the output node, a first terminal coupled to a first node, and a second terminal coupled to second supply voltage. A fourth transistor has a control terminal coupled to the second control node, a first terminal coupled to the first node, and a second terminal coupled to the output node.

20 Claims, 3 Drawing Sheets

BLOCK DECODER OF NONVOLATILE MEMORY AND LEVEL SHIFTER

CROSS REFERENCE TO RELATED APPLICATIONS

This Application claims priority of China Patent Application No. 201711136038.1 filed on Nov. 16, 2017, the entirety of which is incorporated by reference herein.

BACKGROUND OF THE INVENTION

Field of the Invention

The disclosure generally relates to a block decoder and a level shifter, and more specifically, to a block decoder of nonvolatile memory and a level shifter for reducing total layout area.

Description of the Related Art

Nonvolatile memory includes flash memory which can hold data when power is turned off. Data can be erased from or written to the flash memory many times. The flash memory is widely used for general data storage and for data transmission exchanging between a computer and other digital products.

Flash memory includes a plurality of blocks. Each block is accessible to a block decoder. With the increase in the circuit density of the memory, there are more and more blocks and block decoders, and so a larger layout area is required for manufacturing and producing the flash memory. Accordingly, there is a need to propose a novel solution, so as to solve the problem of the conventional flash memory with too large layout area.

BRIEF SUMMARY OF THE INVENTION

In a preferred embodiment, the invention is directed to a block decoder of memory. The block decoder includes a level shifter and a decoder. The level shifter includes a first transistor, a second transistor, a third transistor, and a fourth transistor. The first transistor has a control terminal coupled to a first control node, a first terminal coupled to an output node, and a second terminal coupled to a first supply voltage. The second transistor has a control terminal coupled to a second control node, a first terminal coupled to a ground voltage, and a second terminal coupled to the output node. The third transistor has a control terminal coupled to the output node, a first terminal coupled to a first node, and a second terminal coupled to a second supply voltage. The fourth transistor has a control terminal coupled to the second control node, a first terminal coupled to the first node, and a second terminal coupled to the output node. The decoder is coupled to a third supply voltage. The decoder outputs a first control voltage to the first control node and outputs a second control voltage to the second control node.

In another preferred embodiment, the invention is directed to a level shifter. The level shifter includes a first transistor, a second transistor, a third transistor, and a fourth transistor. The first transistor has a control terminal coupled to a first control node, a first terminal coupled to an output node, and a second terminal coupled to a first supply voltage. The second transistor has a control terminal coupled to a second control node, a first terminal coupled to a ground voltage, and a second terminal coupled to the output node. The third transistor has a control terminal coupled to the output node, a first terminal coupled to a first node, and a second terminal coupled to a second supply voltage. The fourth transistor has a control terminal coupled to the second control node, a first terminal coupled to the first node, and a second terminal coupled to the output node.

The invention can increase the reliability of the whole system and reduce the total area of circuit layout.

DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but equal in function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem and achieve the proposed technical performance within a predetermined error range. Also, the term "couple" is intended to mean either an indirect or direct electrical connection. Accordingly, if one device is coupled to another device, that connection may be through a direct electrical connection, or through an indirect electrical connection via other devices and connections.

Figure 1:
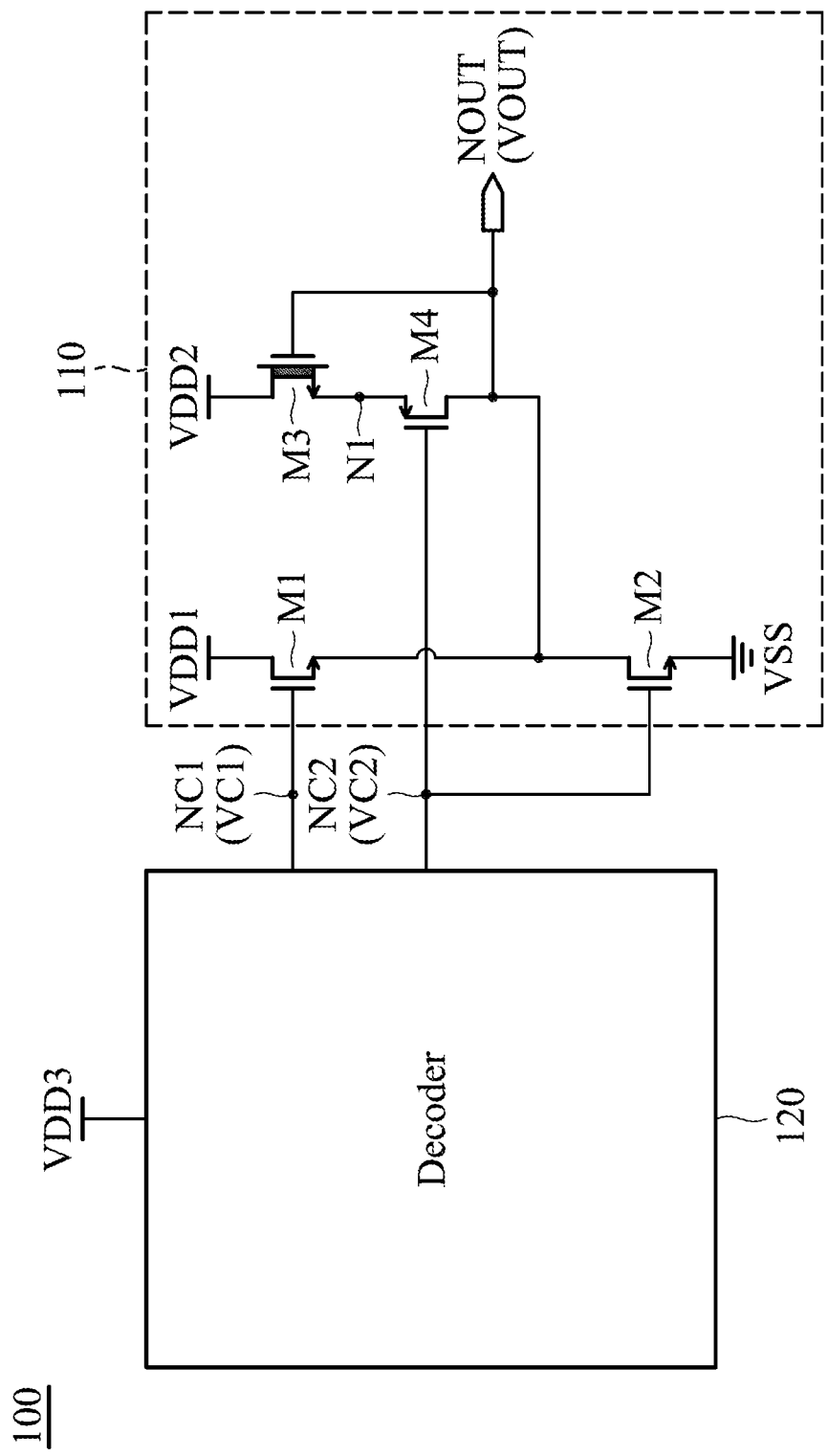
FIG. 1 is a diagram of a block decoder of nonvolatile memory according to an embodiment of the invention.

FIG. 1 is a diagram of a block decoder 100 of nonvolatile memory according to an embodiment of the invention. The block decoder 100 may be used for flash memory, such as NAND flash memory or NOR flash memory. The block decoder 100 is configured to select and access one of a plurality of blocks in flash memory. As shown in FIG. 1, the block decoder 100 includes a level shifter 110 and a decoder 120. The level shifter 110 includes a first transistor M1, a second transistor M2, a third transistor M3, and a fourth transistor M4.

Each of the first transistor M1, the second transistor M2, and the third transistor M3 may be any kind of an N-type transistor. The fourth transistor M4 may be any kind of a P-type transistor. For example, each of the first transistor M1, the second transistor M2, and the third transistor M3 may be an NMOS transistor (N-type Metal Oxide Semiconductor Field Effect Transistor), and the fourth transistor M4 may be a PMOS transistor (P-type Metal Oxide Semiconductor Field Effect Transistor). Specifically, each of the first transistor M1 the second transistor M2, and the fourth transistor M4 may be an enhancement-type transistor, and the third transistor M3 may be a depletion-type transistor.

The first transistor M1 has a control terminal coupled to a first control node NC1 for receiving a first control voltage VC1, a first terminal coupled to an output node NOUT, and a second terminal coupled to a first supply voltage VDD1. The second transistor M2 has a control terminal coupled to a second control node NC2 for receiving a second control voltage VC2, a first terminal coupled to a ground voltage VSS, and a second terminal coupled to the output node NOUT for outputting an output voltage VOUT. The third transistor M3 has a control terminal coupled to the output node NOUT for receiving the output voltage VOUT, a first terminal coupled to a first node N1, and a second terminal coupled to a second supply voltage VDD2. The fourth transistor M4 has a control terminal coupled to the second control node NC2 for receiving the second control voltage VC2, a first terminal coupled to the first node N1, and a second terminal coupled to the output node NOUT for outputting the output voltage VOUT. It should be noted that in each of the aforementioned transistors, the control terminal may be a gate of a transistor, one of the first terminal and the second terminal may be a source of the transistor, and the other of the first terminal and the second terminal may be a drain of the transistor. The symbols of sources of FIG. 1 (the arrow of each transistor) are used for reference only. As a matter of fact, the source and the drain of a transistor may be exchanged with each other due to different voltages applied on the transistor.

The decoder 120 is coupled to a third supply voltage VDD3, outputs the first control voltage VC1 to the first control node NC1, and outputs the second control voltage VC2 to the second control node NC2. The first control voltage VC1 and the second control voltage VC2 may have complementary logic levels. For example, if the first control voltage VC1 is equal to the third supply voltage VDD3 (i.e., a high logic level "1"), the second control voltage VC2 will be equal to the ground voltage VSS (i.e., a low logic level "0"). Conversely, if the first control voltage VC1 is equal to the ground voltage VSS (i.e., the low logic level "0"), the second control voltage VC2 will be equal to the third supply voltage VDD3 (i.e., the high logic level "1").

The operation principle of the block decoder 100 may be as follows. When the corresponding block is selected, the first control voltage VC1 has a high logic level, and the second control voltage VC2 has a low logic level, so as to turn on the first transistor M1 and turn off the second transistor M2. At this time, because the output voltage VOUT at the output node NOUT has a relatively high voltage level and the second control voltage VC2 has a relatively low voltage level, the third transistor M3 and the fourth transistor M4 are both turned on to form a positive feedback loop. The positive feedback loop can continuously pulls up the output voltage VOUT until the output voltage VOUT is equal to almost equal to the second supply voltage VDD2. It should be noted that the second supply voltage VDD2 is usually much higher than the first supply voltage VDD1 and the third supply voltage VDD3. For example, the second supply voltage VDD2 may be at least four times the first supply voltage VDD1 or may be at least four times the third supply voltage VDD3. For example, each of the first supply voltage VDD1 and the third supply voltage VDD3 may be from about 4V to about 7V, and the second supply voltage VDD2 may be about 30V. However, these voltage ranges are merely exemplary, and the invention is not limited thereto. On the other hand, when the corresponding block is unselected, the first control voltage VC1 has a low logic level, and the second control voltage VC2 has a high logic level, so as to turn off the first transistor M1 and turn on the second transistor M2. At this time, because the output voltage VOUT at the output node NOUT has a relatively low voltage level and the second control voltage VC2 has a relatively high voltage level, both the third transistor M3 and the fourth transistor M4 are at least partially turned off. Accordingly, the turned-on second transistor M2 can further pull down the output voltage VOUT at the output node NOUT to the ground voltage VSS (e.g., 0V).

To further improve the operation performance of the block decoder 100, its element parameters may be set as the following equations (1) and (2).

$$VDD3 \geq |VDEP| \quad (1)$$

where "VDD3" represents the voltage level of the third supply voltage VDD3, and "VDEP" represents the voltage level of a threshold voltage of the third transistor M3. In other words, the third supply voltage VDD3 is greater than or equal to the absolute value of the threshold voltage VDEP of the third transistor M3.

Since the third transistor M3 is a depletion-type transistor, its threshold voltage VDEP is usually a negative value (i.e., <0, and e.g., −3V). When the corresponding block is unselected, the third transistor M3 and the fourth transistor M4 should be turned off, so as prevent the second supply voltage VDD2 from being transmitted to the output node NOUT. Therefore, if the third supply voltage VDD3 is designed to be greater than or equal to the absolute value of the threshold voltage VDEP of the third transistor M3, the high logic level of the second control voltage VC2 should be sufficiently high. It is ensured that the fourth transistor M4 is completely turned off, so as to prevent the output voltage VOUT from being affected by the second supply voltage VDD2.

$$VDD3 - VDD1 \geq VTH \quad (2)$$

where "VDD3" represents the voltage level of the third supply voltage VDD3, "VDD1" represents the voltage level of the first supply voltage VDD1, and "VTH" represents the voltage level of a threshold voltage of the first transistor M1. In other words, the third supply voltage VDD3 is higher than the first supply voltage VDD1, and the voltage difference between the third supply voltage VDD3 and the first supply voltage VDD1 is greater than or equal to the threshold voltage VTH of the first transistor M1.

Since the first transistor M1 is an enhancement-type transistor, its threshold voltage VTH is usually a positive value (i.e., >0, and e.g., +1V). When the corresponding block is selected, the third transistor M3 should be turned on to form the positive feedback loop. Therefore, if the third supply voltage VDD3 minus the first supply voltage VDD1 is designed to be still greater than or equal to the threshold voltage VTH of the first transistor M1, a gate-to-source voltage drop of the first transistor M1 for transmitting the high logic level can be cancelled (i.e., when the first transistor M1 is turned on, the output voltage VOUT at the source of the first transistor M1 is usually lower than the first control voltage VC1 at the gate of the first transistor M1, and the voltage difference between them is substantially equal to the threshold voltage VTH of the first transistor M1). It is ensured that the third transistor M3 is completely turned on, so as to immediately pull up the output voltage VOUT to the second supply voltage VDD2.

In some embodiments, the gate length (also called "channel length") of the first transistor M1 is longer than the gate length of the second transistor M2, such that the first transistor M1 can tolerate the higher voltages at its first terminal and second terminal (i.e., the first supply voltage VDD1 and/or the second supply voltage VDD2). The above settings of element parameters are calculated and determined according to many experiment results. According to the practical measurement, they can effectively increase the reliability of the whole system of the block decoder 100.

In addition to the higher reliability of the whole system, the invention has the following advantages over the prior art. First of all, in the invention, because the first transistor M1 and the second transistor M2 are both enhancement-type transistors, the first transistor M1 and the second transistor M2 can share the same semiconductor well during the semiconductor manufacture process, thereby further reducing the layout area of the level shifter 110. It should be noted that a conventional level shifter often needs two or more depletion-type transistors, and the conventional design occupies larger layout area since depletion-type transistors cannot share a semiconductor well with enhancement-type transistors. Furthermore, in the invention, when the corresponding block is unselected and the second control voltage VC2 has a high logic level, the output node NOUT is coupled through the single second transistor M2 to the ground voltage VSS, thereby enhancing the grounding reliability of the output voltage VOUT. In comparison, the output node of the conventional design is usually coupled through a plurality of transistors to the ground voltage. Since the total resistance of the plurality of transistors coupled in series is relatively high, the conventional design has a drawback of unstable grounding mechanism. Therefore, the level shifter 110 is configured to solve a variety of problems of the prior art.

In order to meet different user requirements, the decoder 120 can be implemented with a variety of circuits. The following embodiments describe possible configurations of the decoder 120. It should be understood that these circuit configurations are merely exemplary, rather than limitations of the patent scope of the invention.

Figure 2:
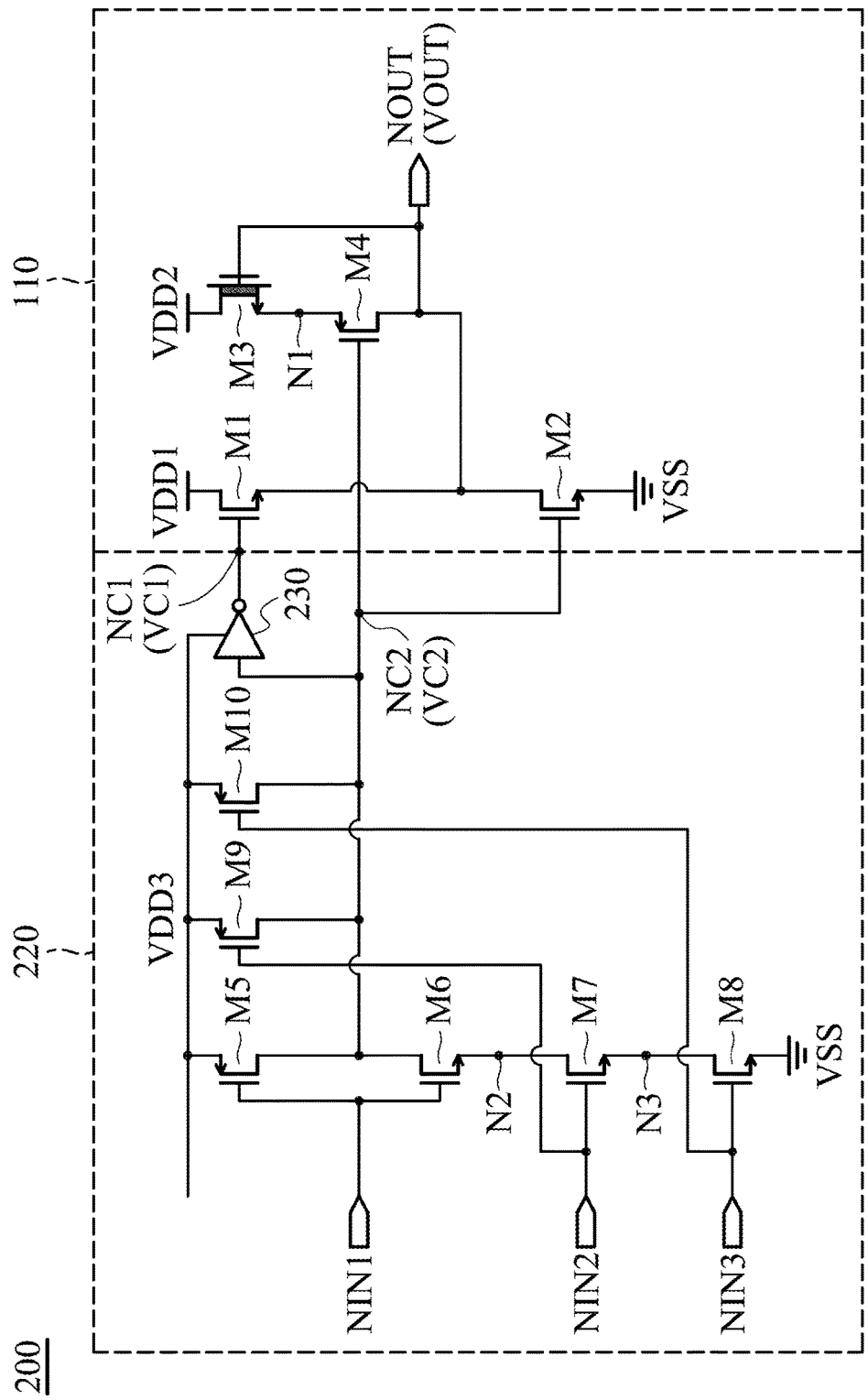
FIG. 2 is a diagram of a block decoder of nonvolatile memory according to an embodiment of the invention.

FIG. 2 is a diagram of a block decoder 200 of nonvolatile memory according to an embodiment of the invention. FIG. 2 is similar to FIG. 1. In the embodiment of FIG. 2, the block decoder 200 includes a level shifter 110 and a decoder 220. The decoder 220 includes a fifth transistor M5, a sixth transistor M6, a seventh transistor M7, an eighth transistor M8, a ninth transistor M9, a tenth transistor M10, and an inverter 230. The structure and function of the level shifter 110 have been described in the embodiment of FIG. 1. As shown in FIG. 2, each of the fifth transistor M5, the ninth transistor M9, and the tenth transistor M10 may be any kind of a P-type transistor, and each of the sixth transistor M6, the seventh transistor M7, and the eighth transistor M8 may be any kind of an N-type transistor. For example, each of the fifth transistor M5, the ninth transistor M9, and the tenth transistor M10 may be a PMOS transistor, and each of the sixth transistor M6, the seventh transistor M7, and the eighth transistor M8 may be an NMOS transistor. Specifically, each of the fifth transistor M5, the sixth transistor M6, the seventh transistor M7, the eighth transistor M8, the ninth transistor M9, and the tenth transistor M10 may be an enhancement-type transistor.

The fifth transistor M5 has a control terminal coupled to a first input node NIN1, a first terminal coupled to the third supply voltage VDD3, and a second terminal coupled to the second control node NC2. The sixth transistor M6 has a control terminal coupled to the first input node NIN1, a first terminal coupled to a second node N2, and a second terminal coupled to the second control node NC2. The seventh transistor M7 has a control terminal coupled to a second input node NIN2, a first terminal coupled to a third node N3, and a second terminal coupled to the second node N2. The eighth transistor M8 has a control coupled to a third input node NIN3, a first terminal coupled to the ground voltage VSS, and a second terminal coupled to the third node N3. The ninth transistor M9 has a control terminal coupled to the second input node NIN2, a first terminal coupled to the third supply voltage VDD3, and a second terminal coupled to the second control node NC2. The tenth transistor M10 has a control terminal coupled to the third input node NIN3, a first terminal coupled to the third supply voltage VDD3, and a second terminal coupled to the second control node NC2. It should be noted that in each of the aforementioned transistors, the control terminal may be a gate of a transistor, one of the first terminal and the second terminal may be a source of the transistor, and the other of the first terminal and the second terminal may be a drain of the transistor. The symbols of sources of FIG. 2 (the arrow of each transistor) are used for reference only. As a matter of fact, the source and the drain of a transistor may be exchanged with each other due to different applied voltages on the transistor. The inverter 230 is coupled to the third supply voltage VDD3. The inverter 230 has an input terminal coupled to the second control node NC2, and an output terminal coupled to the first control node NC1. Generally, the decoder 230 determines the first control voltage VC1 at the first control node NC1 and the second control voltage VC2 at the second control node NC2 according to the voltage at the first input node NIN1, the voltage at the second input node NIN2, and the voltage at the third input node NIN3. The first control voltage VC1 and the second control voltage VC2 should have complementary logic levels since the inverter 230 is coupled between the second control node NC2 and the first control node NC1. For example, the high logic level may be equal to the third supply voltage VDD3, and the low logic level may be equal to the ground voltage VSS. Other features of the block decoder 200 of FIG. 2 are similar to those of block decoder 100 of FIG. 1. Accordingly, the two embodiments can achieve similar levels of performance.

Figure 3:
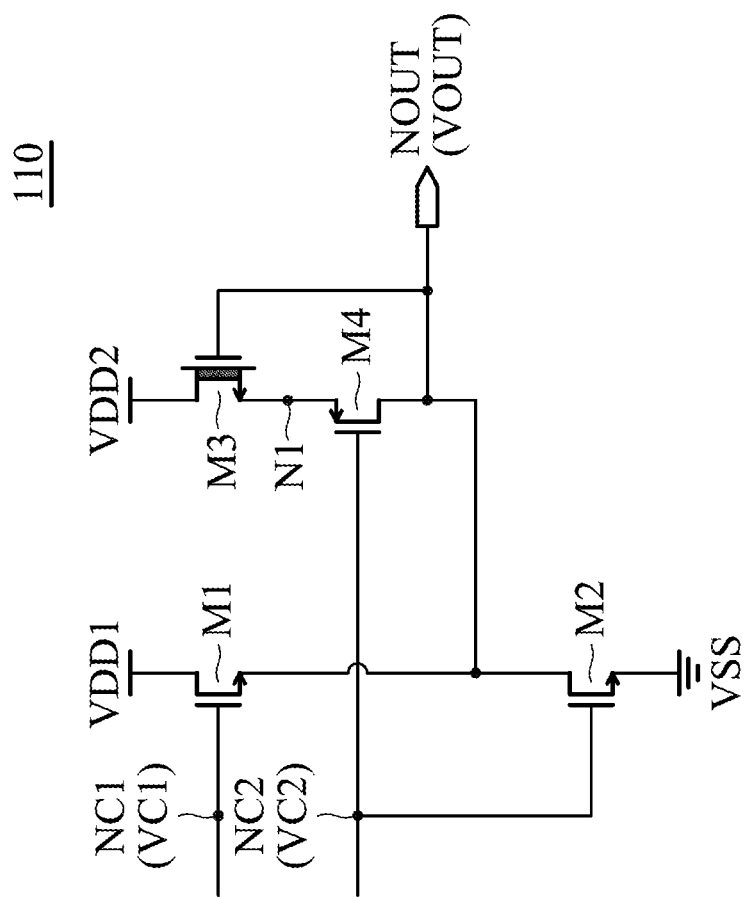
FIG. 3 is a diagram of a level shifter of according to an embodiment of the invention.

FIG. 3 is a diagram of the level shifter 110 of according to an embodiment of invention. The structure and function of the level shifter 110 have been described in the embodiment of FIG. 1. In the embodiment of FIG. 3, the level shifter 110 can be used independently. Alternatively, the level shifter 110 may be used together with a variety of circuits other than the decoders 120 and 220, and it can still provide similar operation performance.

The invention proposes a novel design relative to a block decoder and a level shifter. Compared with the prior art, the proposed design of the invention has at least the advantages of increasing the whole system reliability and reducing the total area of circuit layout. Therefore, the invention is suitable for application in a variety of flash memory devices.

Note that the above element parameters and ranges are not limitations of the invention. A designer can adjust these parameters according to different requirements. The block decoder and the level shifter of the invention are not limited to the configurations of FIGS. 1-3. The invention may merely include any one or more features of any one or more embodiments of FIGS. 1-3. In other words, not all of the features displayed in the figures should be implemented in the block decoder and the level shifter of the invention.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. A block decoder of nonvolatile memory, comprising:
   a level shifter, comprising:
      a first transistor, wherein the first transistor has a control terminal coupled to a first control node, a first terminal coupled to an output node, and a second terminal coupled to a first supply voltage;
      a second transistor, wherein the second transistor has a control terminal coupled to a second control node, a first terminal coupled to a ground voltage, and a second terminal coupled to the output node;
      a third transistor, wherein the third transistor has a control terminal coupled to the output node, a first terminal coupled to a first node, and a second terminal coupled to a second supply voltage; and
      a fourth transistor, wherein the fourth transistor has a control terminal coupled to the second control node, a first terminal coupled to the first node, and a second terminal coupled to the output node; and
   a decoder, coupled to a third supply voltage, wherein the decoder outputs a first control voltage to the first control node and outputs a second control voltage to the second control node.

2. The block decoder of the nonvolatile memory as claimed in claim 1, wherein the first control voltage and the second control voltage have complementary logic levels.

3. The block decoder of the nonvolatile memory as claimed in claim 1, wherein each of the first transistor, the second transistor, and the third transistor is an NMOS transistor (N-type Metal Oxide Semiconductor Field Effect Transistor).

4. The block decoder of the nonvolatile memory as claimed in claim 1, wherein the fourth transistor is a PMOS transistor (P-type Metal Oxide Semiconductor Field Effect Transistor).

5. The block decoder of the nonvolatile memory as claimed in claim 1, wherein each of the first transistor, the second transistor, and the fourth transistor is an enhancement-type transistor.

6. The block decoder of the nonvolatile memory as claimed in claim 1, wherein the third transistor is a depletion-type transistor.

7. The block decoder of the nonvolatile memory as claimed in claim 1, wherein the third supply voltage is greater than or equal to an absolute value of a threshold voltage of the third transistor.

8. The block decoder of the nonvolatile memory as claimed in claim 1, wherein the third supply voltage is higher than the first supply voltage.

9. The block decoder of the nonvolatile memory as claimed in claim 8, wherein a voltage difference between the third supply voltage and the first supply voltage is greater than or equal to a threshold voltage of the first transistor.

10. The block decoder of the nonvolatile memory as claimed in claim 1, wherein the second supply voltage is at least four times the first supply voltage or the third supply voltage.

11. The block decoder of the nonvolatile memory as claimed in claim 1, wherein the decoder comprises:
   a fifth transistor, wherein the fifth transistor has a control terminal coupled to a first input node, a first terminal coupled to the third supply voltage, and a second terminal coupled to the second control node;
   a sixth transistor, wherein the sixth transistor has a control terminal coupled to the first input node, a first terminal coupled to a second node, and a second terminal coupled to the second control node;
   a seventh transistor, wherein the seventh transistor has a control terminal coupled to a second input node, a first terminal coupled to a third node, and a second terminal coupled to the second node; and
   an eighth transistor, wherein the eighth transistor has a control terminal coupled to a third input node, a first terminal coupled to the ground voltage, and a second terminal coupled to the third node.

12. The block decoder of the nonvolatile memory as claimed in claim 11, wherein the decoder further comprises:
   a ninth transistor, wherein the ninth transistor has a control terminal coupled to the second input node, a first terminal coupled to the third supply voltage, and a second terminal coupled to the second control node;
   a tenth transistor, wherein the tenth transistor has a control terminal coupled to the third input node, a first terminal coupled to the third supply voltage, and a second terminal coupled to the second control node; and
   an inverter, coupled to the third supply voltage, wherein the inverter has an input terminal coupled to the second control node, and an output terminal coupled to the first control node.

13. The block decoder of the nonvolatile memory as claimed in claim 12, wherein each of the fifth transistor, the ninth transistor, and the tenth transistor is a PMOS transistor (P-type Metal Oxide Semiconductor Field Effect Transistor).

14. The block decoder of the nonvolatile memory as claimed in claim 12, wherein each of the sixth transistor, the seventh transistor, and the eighth transistor is an NMOS transistor (N-type Metal Oxide Semiconductor Field Effect Transistor).

15. A level shifter, comprising:
   a first transistor, wherein the first transistor has a control terminal coupled to a first control node, a first terminal coupled to an output node, and a second terminal coupled to a first supply voltage;
   a second transistor, wherein the second transistor has a control terminal coupled to a second control node, a first terminal coupled to a ground voltage, and a second terminal coupled to the output node;
   a third transistor, wherein the third transistor has a control terminal coupled to the output node, a first terminal coupled to a first node, and a second terminal coupled to a second supply voltage; and
   a fourth transistor, wherein the fourth transistor has a control terminal coupled to the second control node, a first terminal coupled to the first node, and a second terminal coupled to the output node.

16. The level shifter as claimed in claim 15, wherein a first control voltage at the first control node and a second control voltage at the second control node have complementary logic levels.

17. The level shifter as claimed in claim 15, wherein each of the first transistor, the second transistor, and the third transistor is an NMOS transistor (N-type Metal Oxide Semiconductor Field Effect Transistor).

18. The level shifter as claimed in claim 15, wherein the fourth transistor is a PMOS transistor (P-type Metal Oxide Semiconductor Field Effect Transistor).

19. The level shifter as claimed in claim 15, wherein each of the first transistor, the second transistor, and the fourth transistor is an enhancement-type transistor.

20. The level shifter as claimed in claim 15, wherein the third transistor is a depletion-type transistor.

* * * * *